United States Patent
Fukasawa et al.

(10) Patent No.: US 9,246,377 B2
(45) Date of Patent: Jan. 26, 2016

(54) APPARATUS FOR TRANSFERRING SUBSTRATE

(71) Applicant: Samsung Display Co., Ltd., Yongin-si, Gyeonggi-do (KR)

(72) Inventors: Takayuki Fukasawa, Seoul (KR); Yeon-Keon Moon, Seoul (KR); Sang-woo Sohn, Yongin-si (KR); Katsushi Kishimoto, Hwaseong-si (KR); Sang-Won Shin, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/505,712

(22) Filed: Oct. 3, 2014

(65) Prior Publication Data
US 2015/0188399 A1 Jul. 2, 2015

(30) Foreign Application Priority Data
Dec. 30, 2013 (KR) .................. 10-2013-0167333

(51) Int. Cl.
| B65G 35/00 | (2006.01) |
| H02K 41/03 | (2006.01) |
| H01L 21/677 | (2006.01) |
| H02K 7/09 | (2006.01) |

(52) U.S. Cl.
CPC ............ *H02K 41/031* (2013.01); *H01L 21/677* (2013.01); *H02K 7/09* (2013.01)

(58) Field of Classification Search
CPC .......................... H01L 21/67709; B65G 35/00
USPC ................................................. 198/619, 805
See application file for complete search history.

(56) References Cited

U.S. PATENT DOCUMENTS

| | | | | |
|---|---|---|---|---|
| 4,624,617 A | * | 11/1986 | Belna ..................... | B65G 54/02 104/282 |
| 4,805,761 A | * | 2/1989 | Totsch ................... | B65G 54/02 104/156 |
| 5,833,426 A | * | 11/1998 | Marohl ............. | H01L 21/67748 414/217.1 |
| 5,906,262 A | * | 5/1999 | Miki ..................... | B65G 54/02 198/341.02 |
| 5,990,587 A | * | 11/1999 | Shimanovich ........... | H02K 7/06 310/103 |
| 6,271,606 B1 | * | 8/2001 | Hazelton ............. | G03F 7/70758 250/491.1 |
| 6,361,268 B1 | * | 3/2002 | Pelrine .................. | B65G 54/02 104/284 |
| 6,954,041 B2 | * | 10/2005 | Korenaga ................ | F16C 29/00 310/12.31 |

(Continued)

FOREIGN PATENT DOCUMENTS

| JP | 10-046336 | 2/1998 |
| JP | 2007-214539 | 8/2007 |

(Continued)

*Primary Examiner* — Douglas Hess
(74) *Attorney, Agent, or Firm* — Robert E. Bushnell, Esq.

(57) ABSTRACT

Disclosed is an apparatus for transferring substrates capable of stably transferring substrates by using magnetic levitation. The apparatus includes a substrate stage including a substrate loading unit, a first guide block disposed at a first end of the substrate stage and including a first magnet generator, a second guide block disposed at a second end of the substrate stage and including a second magnet generator, a first guide rail accommodating the first magnet generator and including a third magnet generator, and a second guide rail accommodating the second magnet generator and including a fourth magnet generator. The first magnet generator and the third magnet generator exert repulsive force on each other, and the second magnet generator and the fourth magnet generator exert repulsive force on each other.

15 Claims, 14 Drawing Sheets

(56) References Cited

U.S. PATENT DOCUMENTS

| | | | | |
|---|---|---|---|---|
| 7,121,400 | B2 * | 10/2006 | Fandella | B65G 17/086 198/619 |
| 7,597,186 | B2 * | 10/2009 | Chung | G03G 15/6529 198/619 |
| 7,959,395 | B2 * | 6/2011 | Hofmeister | H01L 21/67161 414/217 |
| 8,261,905 | B2 * | 9/2012 | Kholodenko | H01L 21/67706 198/467.1 |
| 8,528,717 | B2 * | 9/2013 | Ando | B41F 17/005 198/306 |
| 8,602,706 | B2 * | 12/2013 | Hofmeister | H01L 21/67196 198/619 |
| 8,757,177 | B2 * | 6/2014 | Kholodenko | H01L 21/02057 134/49 |
| 8,827,617 | B2 * | 9/2014 | Hofmeister | H01L 21/67161 156/345.31 |
| 9,027,739 | B2 * | 5/2015 | Hosek | F16D 3/00 198/619 |
| 2013/0204244 | A1 | 8/2013 | Sakakita et al. | |
| 2013/0224071 | A1 | 8/2013 | Bernstein | |
| 2013/0224516 | A1 | 8/2013 | Kusinski et al. | |

FOREIGN PATENT DOCUMENTS

| | | |
|---|---|---|
| KR | 1020080046761 | 5/2008 |
| KR | 1020080104479 | 12/2008 |
| KR | 1008808770000 | 1/2009 |
| KR | 1020120088980 | 6/2013 |

\* cited by examiner

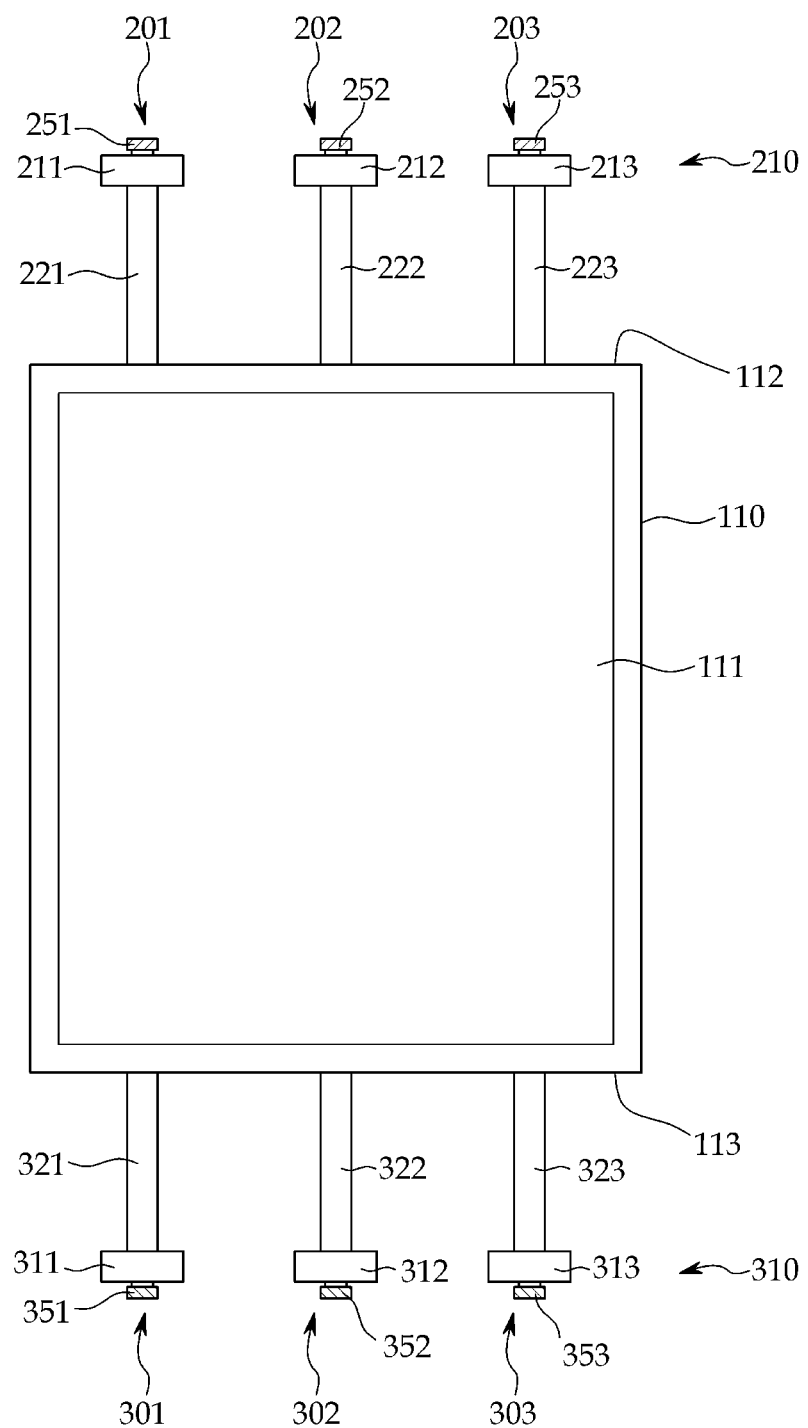

APPARATUS FOR TRANSFERRING SUBSTRATE

CLAIM OF PRIORITY

This application claims priority to and the benefit of Korean Patent Application No. 10-2013-0167333, filed on Dec. 30, 2013, with the Korean Intellectual Property Office, the disclosure of which is incorporated herein in its entirety by reference.

BACKGROUND OF THE INVENTION

1. Field of the Invention

Embodiments of the present invention generally relate to a substrate transfer apparatus, and more particularly, to a substrate transfer apparatus including a substrate stage transferred in a non-contact manner by using magnetic levitation.

2. Description of the Related Art

A manufacturing process of a semiconductor or a flat panel display includes a plurality of different unit processes carried out in different locations. In a case where a semiconductor or a flat panel display is manufactured by using substrates, the substrates are transferred to separate locations and are subject to each unit process, and an apparatus for transferring substrates is thus required.

A contemporary substrate transfer apparatus may use, for example, rollers. The substrate transfer apparatus having rollers transfers the substrates by using sliding drive generated when the transferring rollers are rotated. Because this sliding drive causes friction on contact surfaces, particles are created, and the substrates are consequently contaminated.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY OF THE INVENTION

Aspects of embodiments of the present invention are directed to a substrate transfer apparatus capable of stably transferring substrates loaded on a carrier by using magnetic levitation, such that particles created by friction in the transfer process can be prevented.

Aspects of embodiments of the present invention are further directed to a substrate transfer apparatus including a branch rail branching off in different directions, such that the substrates can be transferred to different locations.

According to an embodiment of the present invention, an apparatus for transferring substrates includes a substrate stage including a substrate loading unit, a first guide block disposed at a first end of the substrate stage and including a first magnet generator, a second guide block disposed at a second end of the substrate stage and including a second magnet generator, a first guide rail accommodating the first magnet generator and including a third magnet generator, and a second guide rail accommodating the second magnet generator and including a fourth magnet generator. The first magnet generator and the third magnet generator exert repulsive force on each other, and the second magnet generator and the fourth magnet generator exert repulsive force on each other.

The first through the fourth magnet generators include at least one of a permanent magnet, an electromagnet, and a super conductor.

The first guide block includes a first mover and the first guide rail includes a first stator disposed to face the first mover. The first mover and the first stator form a first linear motor.

The first stator includes a plurality of magnets capable of changing polarities depending on the location of the first mover.

The first stator includes a plurality of electromagnets.

The first mover is disposed in an accommodation space inside of the first guide rail.

The first mover is disposed outside of the accommodation space of the first guide rail.

The first guide block includes the first mover disposed outside of the first guide rail and the first stator spaced apart from the first guide rail and disposed to face the first mover. The first mover and the first stator form a first linear motor.

The apparatus for transferring substrates further includes a branch rail branching off from the first guide rail.

The apparatus for transferring substrates further includes a rotating rail connected to the first guide rail.

The rotating rail includes a fixed unit making a rotating axis and a rotating unit leading the first magnet generator accommodated in the first guide rail to rotate with respect to the fixed unit.

The second guide block includes a second mover and the second guide rail includes a second stator disposed to face the second mover. The second mover and the second stator form a second linear motor.

The second stator includes a plurality of magnets capable of changing polarities depending on the location of the second mover.

The second stator includes a plurality of electromagnets.

According to embodiments of the present invention, the substrate transfer apparatus can provide the stable magnetic levitation by accommodating the magnet generators disposed at the guide block of the carrier in the accommodation space of the guide rail, such that friction between elements of the carrier and the guide rail can be prevented. Therefore, substrates can be stably transferred without creating particles. According to embodiments of the present invention, the substrate transfer apparatus is further capable of transferring the substrates in different directions.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 3 is a front view showing a carrier of the substrate transfer apparatus;

DETAILED DESCRIPTION

Figure 1:
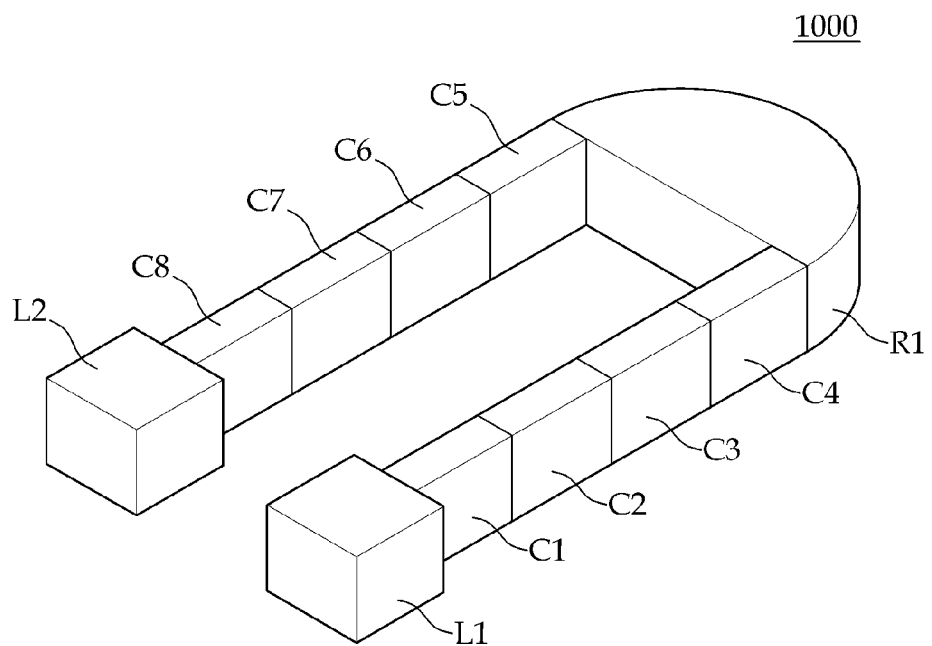
FIG. 1 is an embodiment of an in-line substrate treatment apparatus.

Hereinafter, embodiments of the present invention will be described in more detail with reference to the accompanying drawings.

Although the present invention can be modified in various manners and have several embodiments, specific embodiments are illustrated in the accompanying drawings and will be mainly described in the specification. However, the scope of the embodiments of the present invention is not limited to the specific embodiments and should be construed as including all the changes, equivalents, and substitutions included in the spirit and scope of the present invention.

In the drawings, certain elements or shapes may be simplified or exaggerated to better illustrate the present invention, and other elements present in an actual product may also be omitted. Like reference numerals refer to like elements throughout the specification. Thus, the drawings are intended to facilitate the understanding of the present invention.

In order to avoid the above problems such as contamination of substrates during to substrate transferring, a substrate transfer apparatus using magnetic may be used. The substrate transfer apparatus using magnetic levitation is provided with a carrier on which the substrates are loaded and a rail which leads the way for the carrier. Although the magnetic levitation method provides the benefit of non-contact suspension, the carrier is affected by gravity and acceleration, thereby making it difficult to maintain stability. As a result, the carrier may contact the leading rail and causes friction in the transfer process or the directions available for transferring substrates may be limited.

FIG. 1 illustrates an in-line substrate treatment apparatus including multiple chambers for a plurality of unit processes. The substrate treatment apparatus 1000 of FIG. 1 includes a substrate loading unit L1, substrate treatment units C1~C8, a rotating unit R1, and a substrate unloading unit L2 arranged to make an in-line type. The substrate treatment units C1~C8 may perform various processes therein and may include, for example, a first cleaning unit C1, a second cleaning unit C2, a drying unit C3, a first deposition unit C4, a direction conversion unit R1, a heating unit C5, a second deposition unit C6, a heating unit C7, and a cooling unit C8. However, embodiments of the present invention are not limited thereto, and thus other processes, although not described above, can be also performed in the substrate treatment units.

As an example of substrates treated by the above substrate treatment apparatus, there is a display substrate for manufacturing a flat panel display device such as an organic light emitting display or a liquid crystal display. In addition, a wafer of a semiconductor can also be treated by the above substrate treatment apparatus.

Such a substrate treatment apparatus includes a substrate transfer apparatus in order to transfer substrates to locations where each process is carried out.

Figure 2:
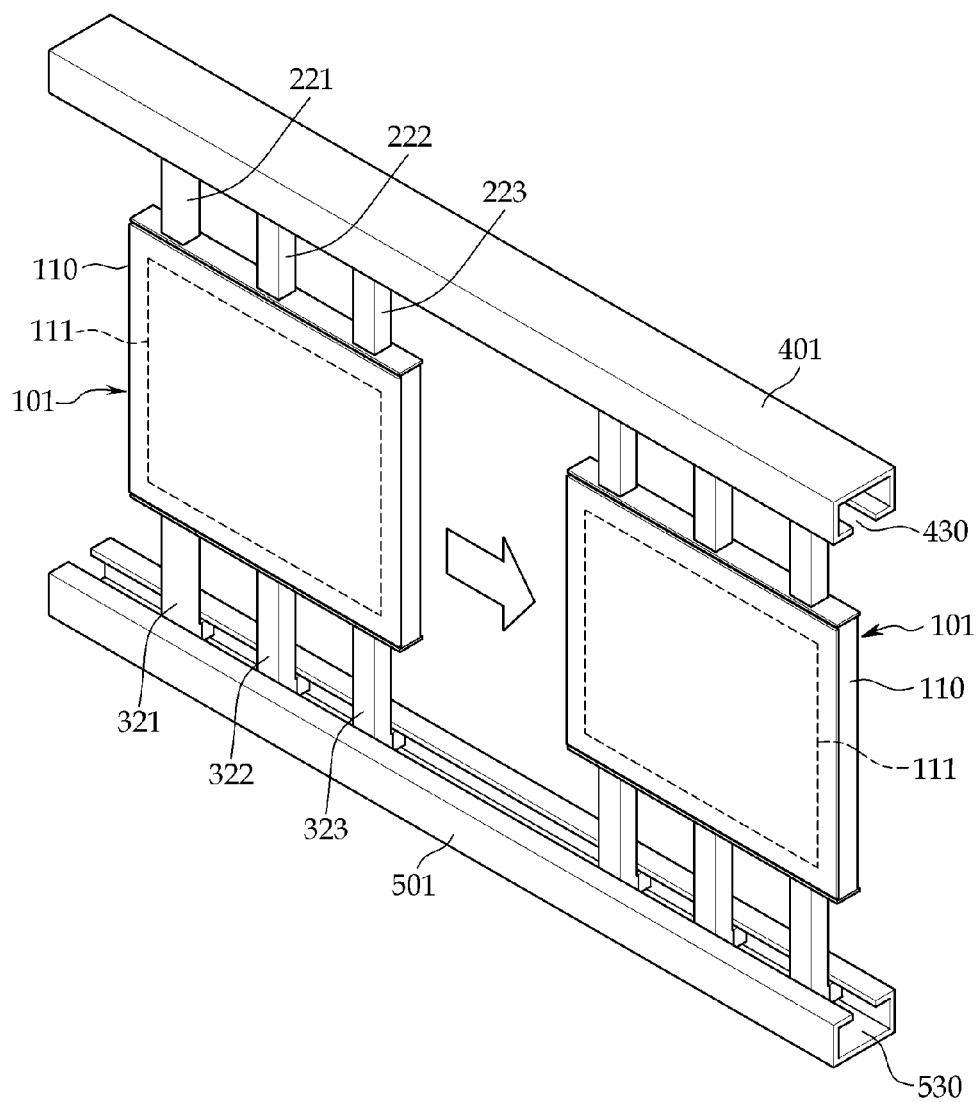
FIG. 2 is an oblique diagram showing a substrate transfer apparatus according to an embodiment of the present invention.

FIG. 2 is an oblique diagram showing a substrate transfer apparatus according to an embodiment of the present invention.

The substrate transfer apparatus 10 includes a carrier 101 including a substrate stage 110 in which a substrate is loaded, and a first guide rail 401 and a second guide rail 501 disposed at opposite sides of the carrier 101 in order to lead the way for the carrier 101.

FIG. 3 illustrates the carrier 101 of the substrate transfer apparatus according to an embodiment of the present invention. The carrier 101 includes the substrate stage 110, first guide blocks 201, 202, and 203, and second guide blocks 301, 302, and 303.

The substrate stage 110 includes a substrate loading unit 111 in which a substrate 800 is loaded. The substrate stage 100 may be made of at least one nonmagnetic material of ceramic, aluminum, or aluminum alloy. For example, an electrostatic chuck may be used as the substrate stage 110, and in this case, although not illustrated in a drawing, an electrode supplied with power may be embedded inside of the substrate stage 110. Therefore, when a high voltage is applied to the electrode, the substrate can be stably loaded in the substrate loading unit 111.

Although not illustrated in a drawing, a clamp, for example, may be disposed on the substrate stage 110 in order to fix the substrates.

The first guide blocks 201, 202, and 203 including first magnet generating unit 210 are disposed at a first end 112 of the substrate stage 110. The first magnet generating unit 210 includes first magnet generators 211, 212, and 213. In other words, the carrier 101 illustrated in FIG. 3 includes the three first guide blocks 201, 202, and 203 including the first magnet generators 211, 212, and 213, respectively. Each of the first magnet generators 211, 212, and 213 is connected to the substrate stage 110 having first support units 221, 222, and 223 therebetween.

In addition, the second guide blocks 301, 302, and 303 including second magnet generating unit 310 are disposed at a second end 113 of the substrate stage 110. The second magnet generating unit 310 includes second magnet generators 311, 312, and 313. In this case, the second end 113 refers to the opposite end from the first end 112. In more detail, the carrier 101 illustrated in FIG. 3 includes three second guide blocks 301, 302, and 303, and each of the three second guide blocks includes the second magnet generators 311, 312, and 313, respectively. Each of the second magnet generators 311, 312, and 313 is connected to the substrate stage 110 having second support units 321, 322, and 323 therebetween.

The first support units 221, 222, and 223 and the second support units 321, 322, and 323 may be made of at least one nonmagnetic material of ceramic, aluminum, or aluminum alloy. Further, the first magnet generators 211, 212, and 213 and the second magnet generators 311, 312, and 313 may include at least one of a permanent magnet, an electromagnet and a super conductor, respectively.

The first magnet generators 211, 212, and 213 and the second magnet generators 311, 312, and 313 are accommodated in the accommodation space 430 and 530 of the first guide rail 401 and the second guide rail 501, respectively.

Figure 4A:
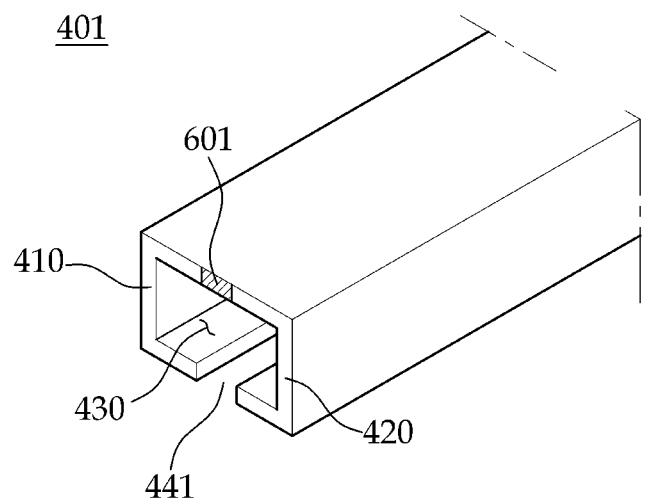
FIGS. 4A and 4B are oblique diagrams showing a first guide rail and a second guide rail.
Figure 4B:
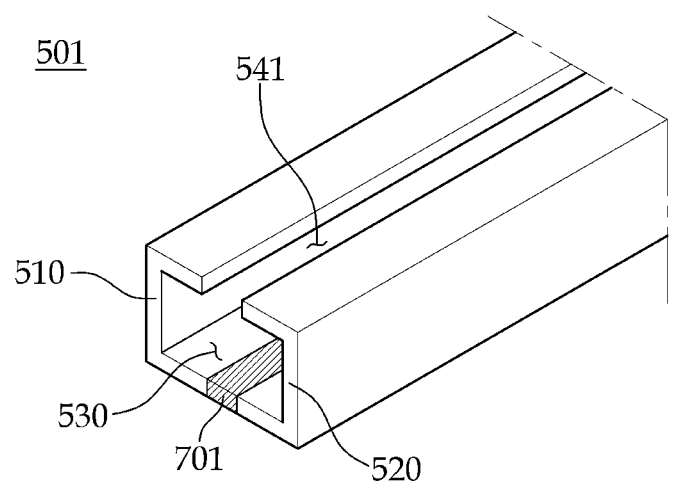

In more detail, FIGS. 4A and 4B illustrate the first guide rail 401 and the second guide rail 501 according to an embodiment of the present invention.

The first guide rail 401 accommodates the first magnet generators 211, 212, and 213 of the first guide blocks 201, 202, and 203 and leads the way for the first guide blocks 201, 202, and 203. The second guide rail 501 accommodates the second magnet generators 311, 312, and 313 of the second guide blocks 301, 302, and 303 and leads the way for the second guide blocks 301, 302, and 303.

The first guide rail 401 includes third magnet generators 410 and 420. Further, the first guide rail 401 have the inside accommodation space 430 in order to accommodate the first magnet generators 211, 212, and 213 and an opening 441 formed to transfer the first support units 221, 222, and 223.

The third magnet generators 410 and 420, and the first magnet generators 211, 212, and 213 exert repulsive force on each other. Consequently, an air-gap is formed between the first magnet generators 211, 212, and 213 and the first guide rail 401 in the accommodation space 530 of the first guide rail 401, and thus, a magnetically levitated state is formed. Therefore, the first magnet generators 211, 212, and 213 may be transferred without contacting the first guide rail 401 in the accommodation space 430 of the first guide rail 401.

The second guide rail 501 includes fourth magnet generators 510 and 520. Further, the second guide rail 501 includes the inside accommodation space 530 for accommodating the second magnet generators 311, 312, and 313 and the opening 541 for transferring the second support units 321, 322, and 323.

The fourth magnet generators 510 and 520, and the second magnet generators 311, 312, and 313 exert repulsive force on each other. Consequently, an air-gap is formed between the second magnet generators 311, 312, and 313 and the second guide rail 501 in the accommodation space 530 of the second guide rail 501; in other words, a magnetically levitated state can be formed. As a result, the second magnet generators 311, 312, and 313 may be transferred without contacting the second guide rail 501 in the accommodation space 530 of the second guide rail 501.

The second magnet generators and the fourth magnet generators may include at least one of a permanent magnet, an electromagnet and a super conductor.

More particularly, a super conductor exerts repulsive force on all magnetic fields. Therefore, in a case where the first and the second magnet generators are, for example, super conductors, the first and the second magnet generators can be magnetically levitated, as long as the third and the fourth magnet generators 410, 420, 510 and 520 disposed on the first and the second guide rails 401 and 501 generate magnetic fields. In this case, the range of choices for selecting the material of the third and the fourth magnet generators can be expanded.

For example, each of the third magnet generators 410 and 420 and the fourth magnet generators 510 and 520 can include either a permanent magnet or an electromagnet, respectively.

Figure 5:
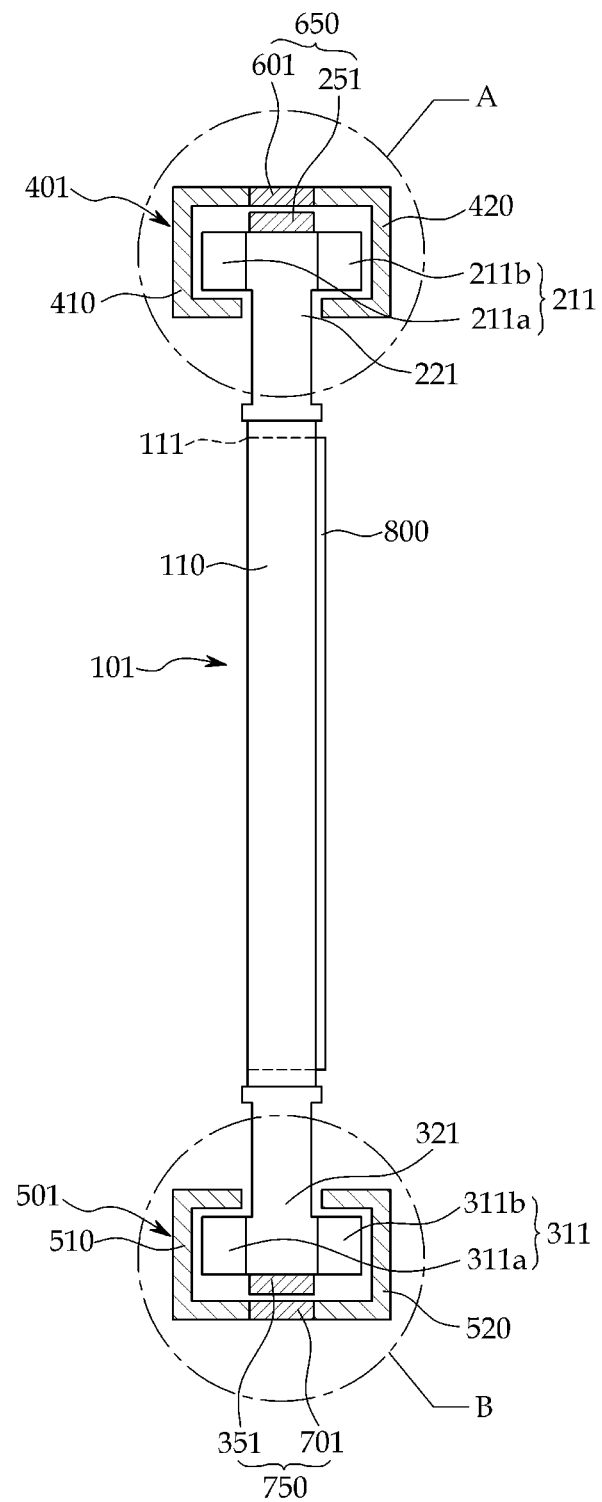
FIG. 5 is a vertical cross-sectional view showing the substrate transfer apparatus of FIG. 2.

FIG. 5 is a cross-sectional view showing the substrate transfer apparatus 10 of FIG. 2 taken along the first guide block 201 and the second guide block 301. Described herein are an arrangement relationship between the first magnet generator 211 and the first guide block 401 and an arrangement relationship between the second magnet generator 311 and the second guide block 501.

Figure 6A:
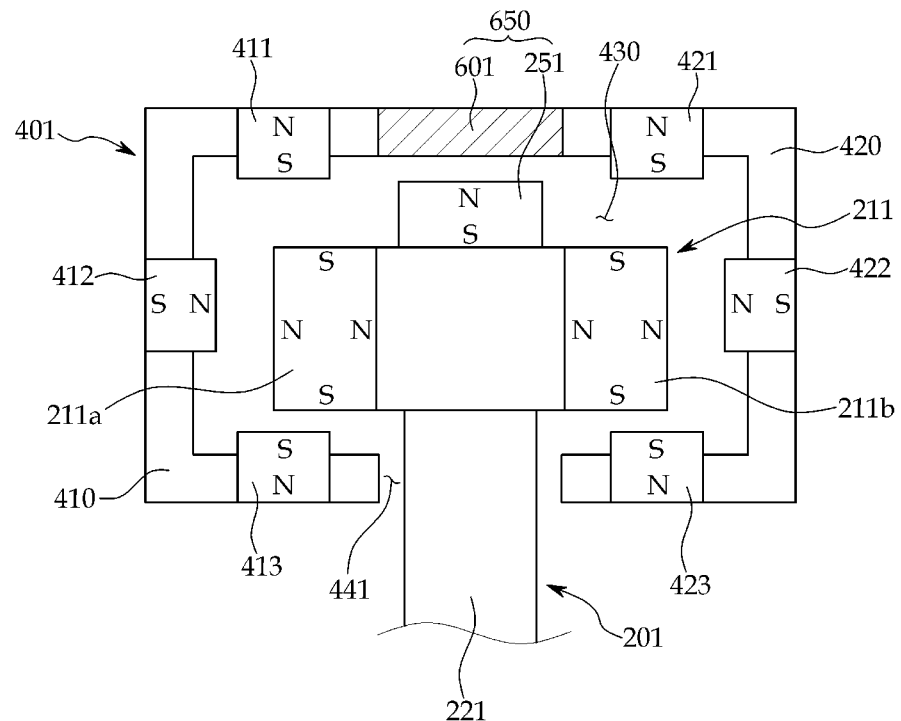
FIGS. 6A and 6B are partially enlarged cross-sectional views enlarging a state where a first magnet generator and a second magnet generator are accommodated in the first guide rail and the second guide rail, respectively.

In addition, FIG. 6A is a partially enlarged cross-sectional view enlarging "A" part of FIG. 5, and a cross-sectional view of the first magnet generator 211 and the first guide block 401 is illustrated.

Referring to FIG. 5 and FIG. 6A, first side magnet generators 211a and 211b are respectively disposed at opposite sides of the first support unit 221. The first side magnet generators 211a and 211b may be made of a permanent magnet or an electromagnet. In the first side magnet generators 211a and 211b of FIG. 6A, exposed parts at the sides have an N-pole, while exposed parts at the upper and lower sides have an S-pole. Polarities of the magnets can be formed differently where necessary. As described above, the first side magnet generators 211a and 211b may be made of a super conductor.

The first guide rail 401 includes the third magnet generators 410 and 420 covering the first magnet generators 211a and 211b. The third magnet generators 410 and 420 include magnetic force generating elements 411, 412, 413, 421, 422, and 423 such as a permanent magnet or an electromagnet. The magnetic force generating elements 411, 412, 413, 421, 422, and 423 of the third magnet generators 410 and 420 are disposed to have the same polarities as the polarities of the facing surfaces of the first side magnetic generators 211a and 211b. As a result, the first side magnet generators 211a and 211b of the first magnet generator 211 and the third magnet generators 410 and 420 exert repulsive force on each other, such that the first magnet generators 211a and 211b and the first guide rail 401 can be spaced apart from each other.

Figure 6B:
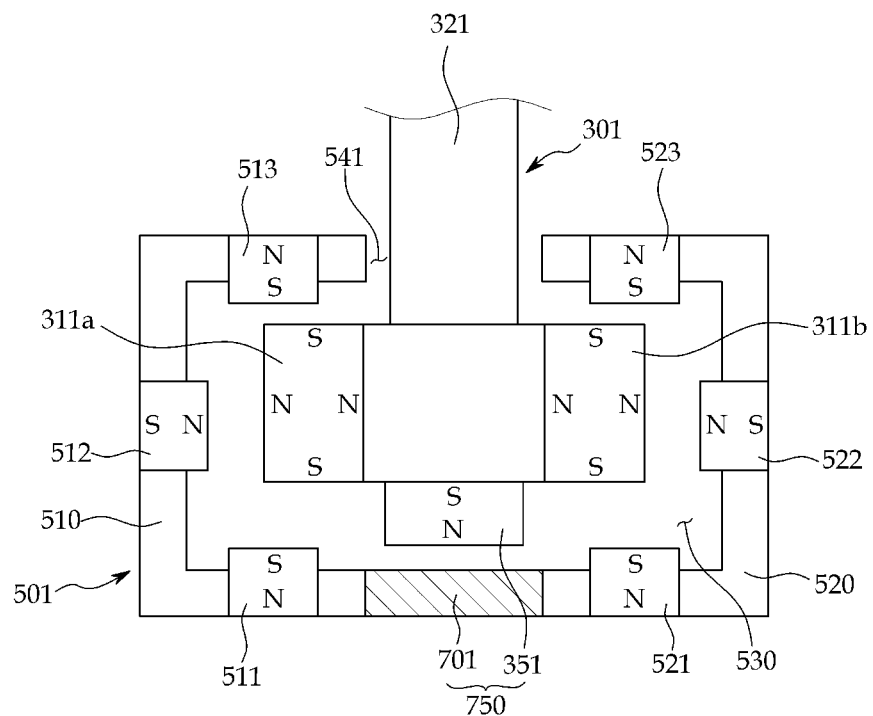

FIG. 6B is a partially enlarged cross-sectional view enlarging "B" part of FIG. 5, and a cross-sectional view of the second magnet generator 311 and the second guide block 501 is illustrated.

Referring to FIG. 6B, the second side magnet generators 311a and 311b are disposed at opposite sides of the second support unit 321. Further, the second guide rail 501 includes the fourth magnet generators 510 and 520 covering the second side magnet generators 311a and 311b. The fourth magnet generators 510 and 520 include magnetic force generating elements 511, 512, 513, 521, 522, and 523 such as a permanent magnet or an electromagnet. The magnetic force generating elements of the fourth magnet generators 510 and 520 are disposed to have the same polarities as the polarities of the facing surfaces of the second side magnetic generators 311a and 311b. As a result, the second side magnet generators 311a and 311b of the second magnet generator 311 and the fourth magnet generators 510 and 520 exert repulsive force on each other, such that the second side magnet generators 311a and 311b and the second guide rail 501 can be spaced apart from each other.

As a result, the first and the second magnet generators are disposed at opposite sides of the substrate stage 110, and the first and the second generators are accommodated in the first and the second guide rails 401 and 501 provided with magnetic suspension; therefore, the carrier 101 of the substrate transfer apparatus can be stably transferred maintaining a stable non-contact structure.

The substrate transfer apparatus 10 includes a first linear motor 650 configured to transfer the carrier 101. The first linear motor 650 includes first movers 251, 252, and 253 disposed at an end of the first guide blocks 201, 202, and 203 and a first stator 601 disposed to face the first movers 251, 252, and 253.

In more detail, referring to FIGS. 2, 3, and 6A, the first movers 251, 252, and 253 may be made of permanent magnets disposed at each end of the three first support units 221, 222, and 223 forming the first guide blocks 201, 202, and 203.

As illustrated in FIG. 6A, the first stator 601 may be disposed at the first guide rail 401 and include a plurality of magnets. As an example of the plurality of magnets disposed at the second stator 601, an electromagnet capable of changing polarities depending on the location of the first movers 251, 252, and 253 can be used.

Figure 7A:
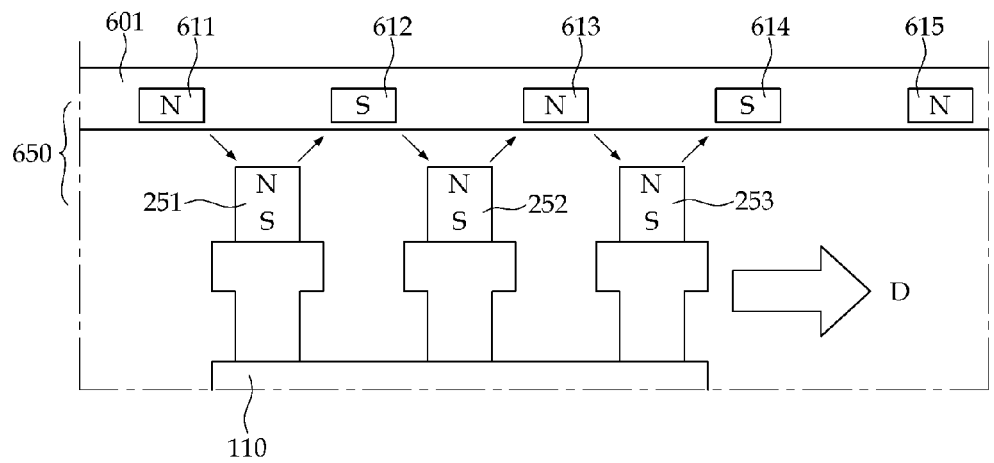
FIGS. 7A and 7B are schematic diagrams illustrating a driving mechanism of a linear motor.
Figure 7B:
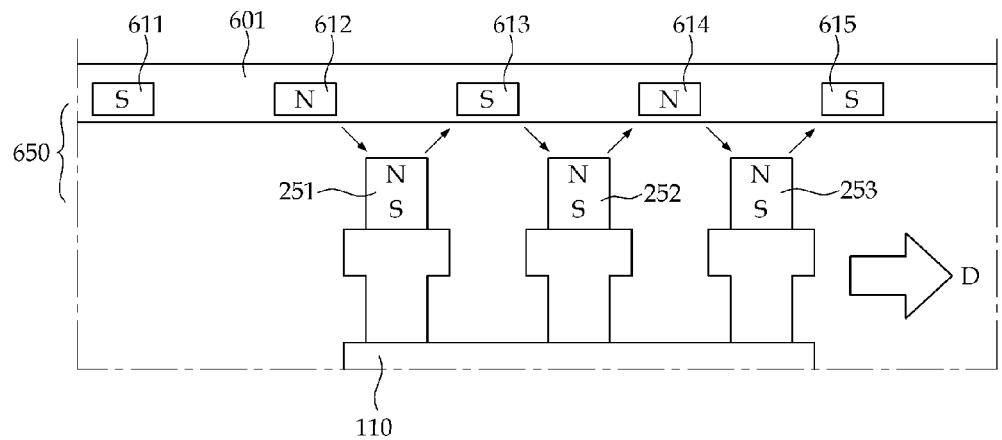

FIGS. 7A and 7B illustrate a configuration and a driving mechanism of the first linear motor 650. The first stator 601 of FIG. 7A includes a plurality of electromagnets 611, 612, 613, 614, and 615. However, embodiments of the present invention are not limited thereto, and thus additional electromagnets can be disposed at the first guide rail 401.

FIGS. 7A and 7B illustrate a change in magnetic polarities in a case where the substrate stage 110 is transferred to the right direction D. In this case, polarities of the plurality of electromagnets 611, 612, 613, 614, and 615 are changed, such that moving force for transferring the first movers 251, 252, and 253 to a direction D can be generated.

For example, referring to FIG. 7A, the third electromagnet 613 of the first stator 601 has an N-pole surface facing the first mover, such that the first mover 252 on the left side of the third electromagnet 613 can be pulled to the right direction D and the first mover 253 on the right side of the third electromagnet 613 can be pushed to the right direction D.

In addition, in a case where the carrier is transferred and the substrate stage 110 is located at a position illustrated in FIG. 7B, the third electromagnet 613 has an S-pole surface facing the first mover, such that the first mover 251 on the left side of the third electromagnet 613 is pulled to the right direction D and the first mover 252 on the right side of the third electromagnet 613 is pushed to the right direction D. Thus, this change in polarities of the electromagnets disposed at the first stator 601 can lead the substrate stage 110 to be transferred.

In order to stably transfer the substrate stage 110, a second linear motor 750 may be disposed at the opposite end from the first linear motor 650. The second linear motor 750 includes second movers 351, 352, and 353 disposed at an end of the second guide blocks 301, 302, and 303 and a second stator 701 disposed to face the second movers 351, 352, and 353.

In more detail, the second movers 351, 352, and 353 may be made of permanent magnets disposed at each end of the three second support units 321, 322, and 323 forming the second guide blocks 301, 302, and 303.

The second stator 701 may be disposed at the second guide rail 501 and include a plurality of magnets. As an example of the plurality of magnets disposed at the second stator 701, an electromagnet capable of changing polarities depending on the location of the first movers 351, 352, and 353 can be used.

Thus, the first magnet generators 211, 212, and 213 and the second magnet generators 311, 312, and 313 are accommodated in the accommodation space of the first guide rail 401 and the second guide rail 501, respectively, and thus the carrier can maintain a stable erect state, such that the substrate 800 loaded in the substrate stage 110 of the carrier can be stably transferred.

Hereinafter, another embodiment of the present invention will be described with reference to FIGS. 8 through 10.

Figure 8:
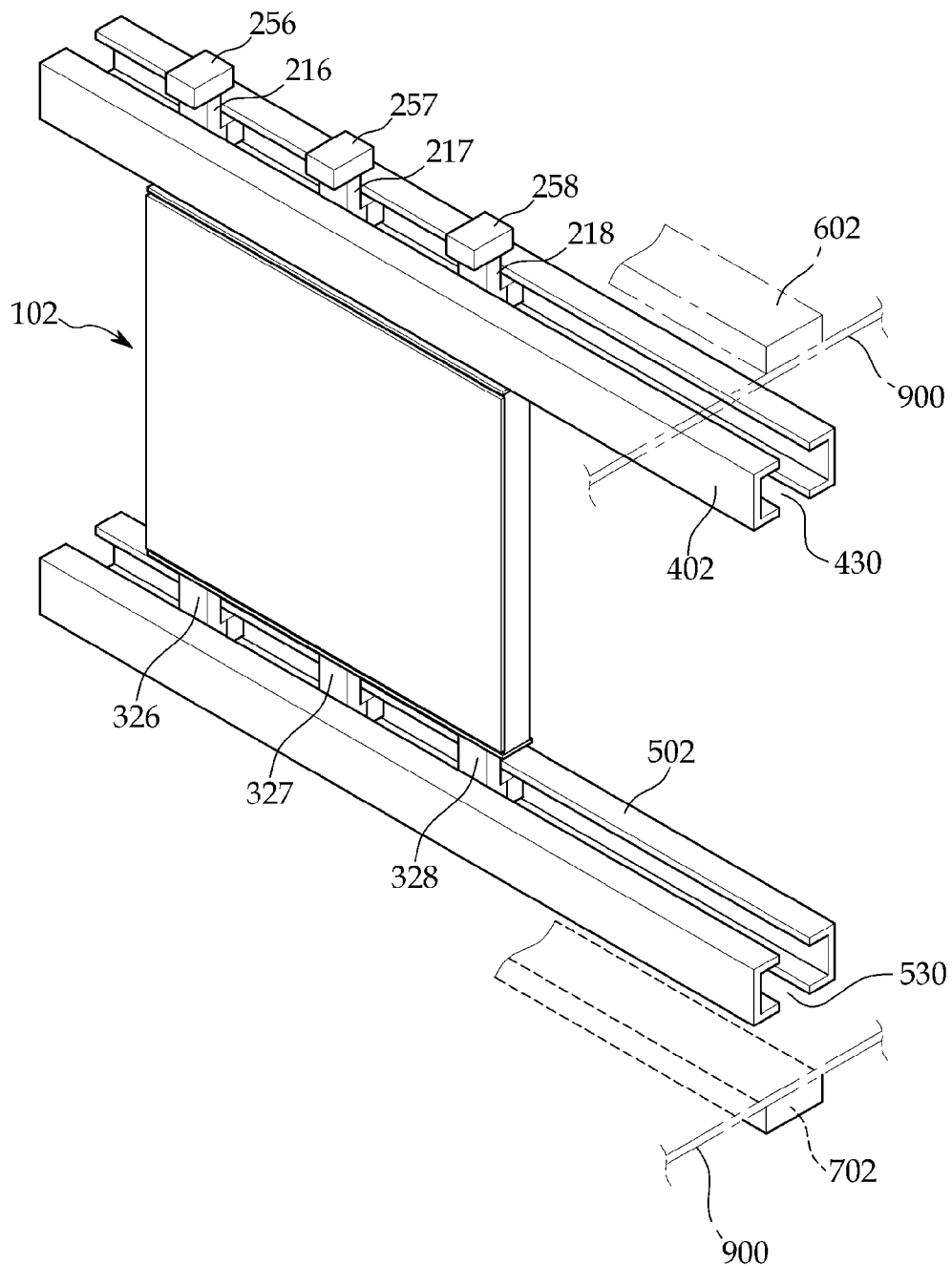
FIG. 8 is an oblique diagram showing a substrate transfer apparatus according to another embodiment of the present invention.

Referring to FIG. 8, a substrate transfer apparatus 20 includes first movers 256, 257, and 258 disposed outside of the first guide rail 402 and second movers 356, 357, and 358 disposed outside of the second guide rail 502.

Figure 9:
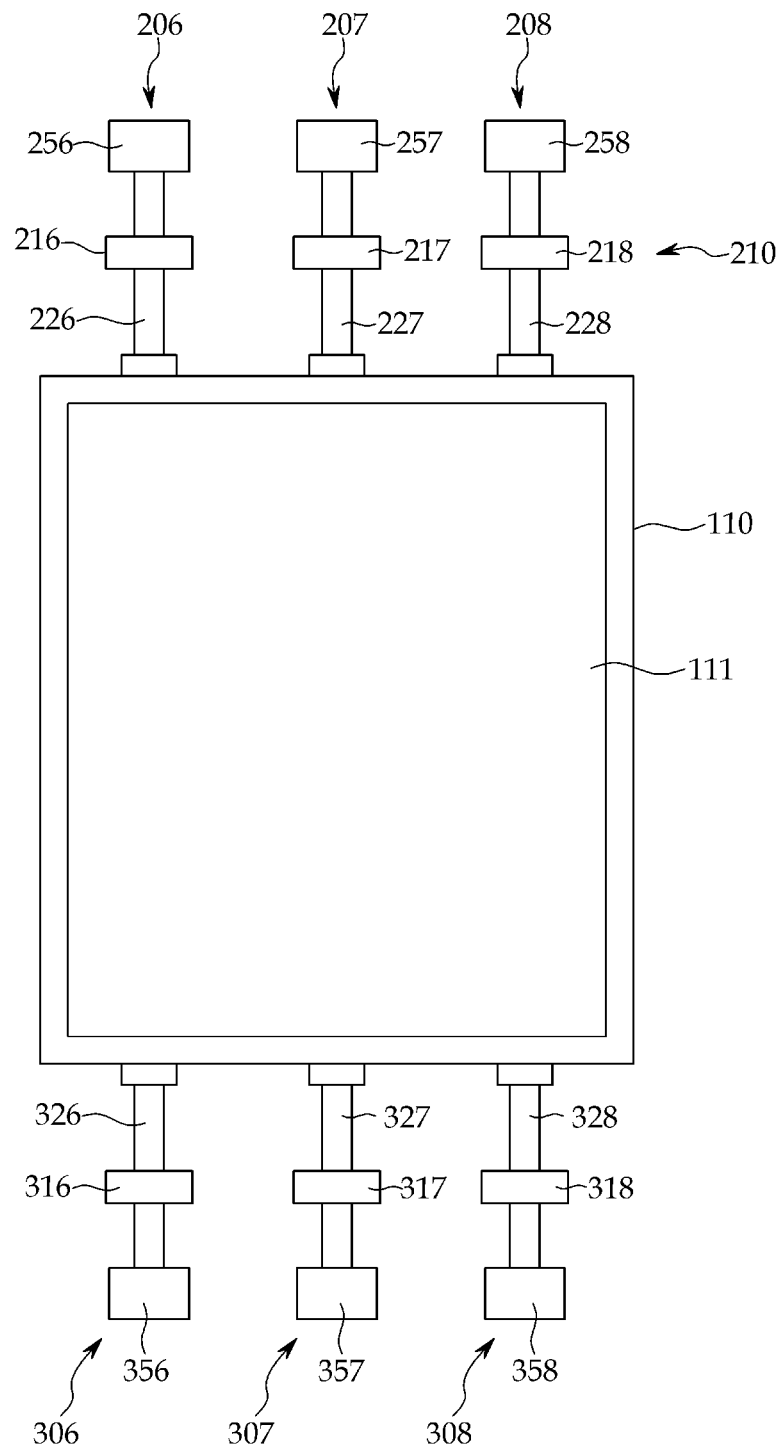
FIG. 9 is a front view showing a carrier which can be applied to the substrate transfer apparatus of FIG. 8.

A carrier 102 illustrated in FIG. 9 can be used for the substrate transfer apparatus 20.

Referring to FIG. 9, the carrier 102 includes three first guide blocks 206, 207, 208 at the first end of the substrate stage 110. The first guide blocks 206, 207 and 208 include first support units 226, 227, and 228 disposed at the first end of the substrate stage 110, and the first movers 256, 257, and 258 are disposed at each end of the first support units 226, 227, and 228, while first magnet generators 216, 217, and 218 are respectively disposed at the first support units 226, 227, and 228 and spaced apart from the first movers 256, 257, and 258.

In addition, three second guide blocks 306, 307, and 308 are disposed at the second end of the substrate stage 110; in this case, the second end refers to the opposite end from the first support units 226, 227, and 228. In other words, the second guide blocks 306, 307, and 308 include second support units 326, 327, and 328 disposed at the second end of the substrate stage 110, and second movers 356, 357, and 358 are disposed at each end of the second support units 326, 327, and 328, while second magnet generators 316, 317, and 318 are respectively disposed at the second support units and spaced apart from the second movers 356, 357, and 358.

Figure 10:
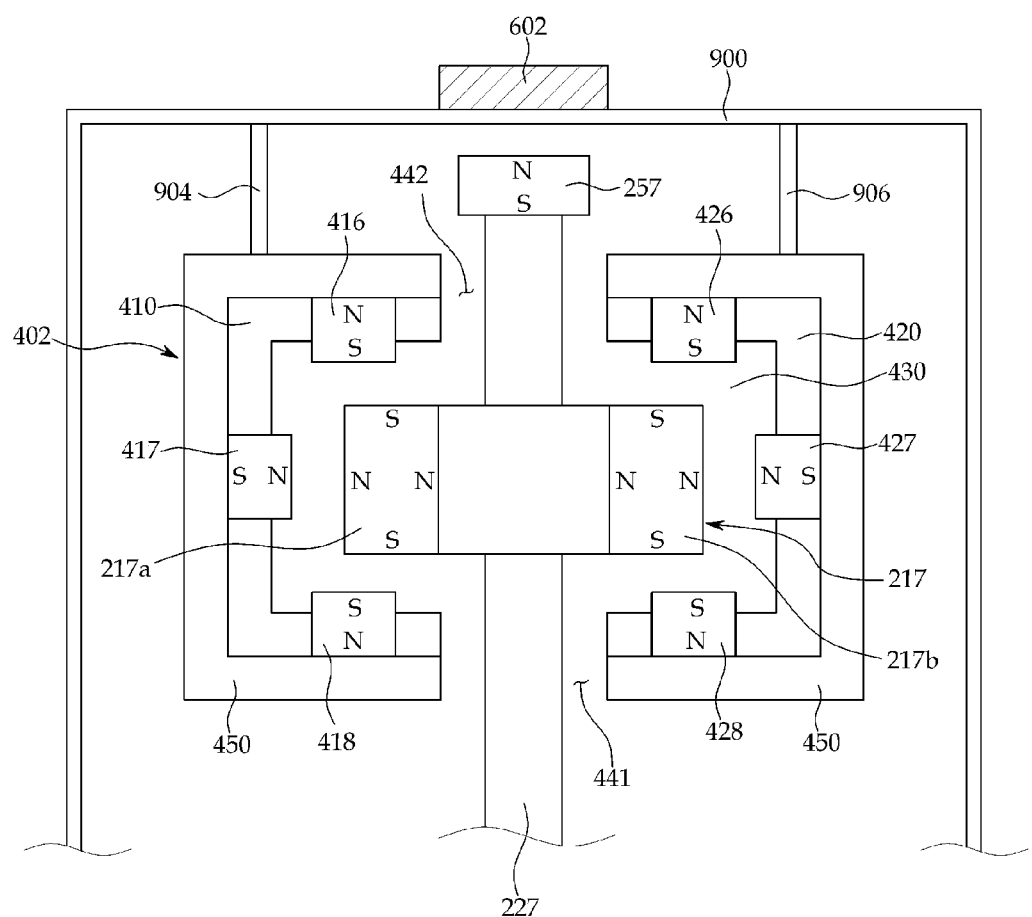
FIG. 10 is a cross-sectional view showing a first magnet generator accommodated in a first guide rail of the substrate transfer apparatus of FIG. 8.

An arrangement relationship among the first magnet generator 217, the first mover 257, and the first guide rail 402 is illustrated in FIG. 10. Referring to FIG. 10, the first mover 257 is spaced apart from the first magnet generator 217 and disposed outside of the first guide rail 402. The first magnet generator 217 includes first side magnet generators 217a and 217b. In this case, the first support unit 227 passes through the first guide rail 402 to reach outside of the first guide rail 402, and the first mover 257 is disposed at the end of the first support unit 227. The first guide rail 402 has openings 441 and 442 at the upper and lower portions respectively in order to transfer the first support unit.

Meanwhile, the first magnet generator 217 is accommodated in the accommodation space 430 inside of the first guide rail 402.

Thus, provided that the first mover 257 is disposed outside of the first guide rail 402, the first mover 257 can be spaced sufficiently apart from the first magnet generator 217 and the third magnet generators 410 and 420, such that effect of magnetic force generated by the first magnet generator 217 and the third magnet generators 410 and 420 on the first mover 257 can be reduced or prevented. It is advantageous to have the first mover of the first linear motor not affected by magnetic force generated by the first magnet generator 217 and the third magnet generators 410 and 420.

In order to avoid the effect of magnetic force generated from the first magnet generator and the third magnet generator on the first mover, a magnet york 450 can be disposed around the third magnet generators 410 and 420. Thus, the first guide rail 402 can include the magnet york 450 supported by the chamber 900 via supporting members 904 and 906.

Likewise, the second magnet generator 317 is accommodated in the accommodation space 530 inside of the second guide rail 502, while the second mover 357 is disposed outside of the second guide rail 502. Thus, provided that the second mover 357 is disposed outside of the second guide rail 502, the second mover 357 can be located sufficiently apart from the second magnet generator 317 and the fourth magnet generators 510 and 520, such that an effect of magnetic force generated by the second magnet generator 317 and the fourth magnet generators 510 and 520 on the second mover 357 can be decreased or prevented. Further, a magnet york may be disposed at the second guide rail 502 around the fourth magnet generators 510 and 520 in order to avoid magnetic field interference.

As illustrated in FIGS. 8 and 10, the substrate transfer apparatus 20 may be disposed inside of a chamber.

In this case, a first stator 602 forming the first linear motor with the first mover may be disposed on a wall of the chamber 900. As illustrated in FIG. 10, the first mover 602 may be disposed outside of the chamber 900. Although not illustrated in a drawing, the first stator 602 may be disposed on an inside wall of the chamber 900.

Although not illustrated in a drawing, a separate fixing unit for the first stator may be included, such that the first stator can be disposed apart from the chamber.

The second guide rail 502 may be disposed inside of the chamber 900, and the second stator 702 may be disposed on the outside or inside wall of the chamber 900.

Hereinafter, another embodiment of the present invention will be described with reference to FIG. 11.

Figure 11:
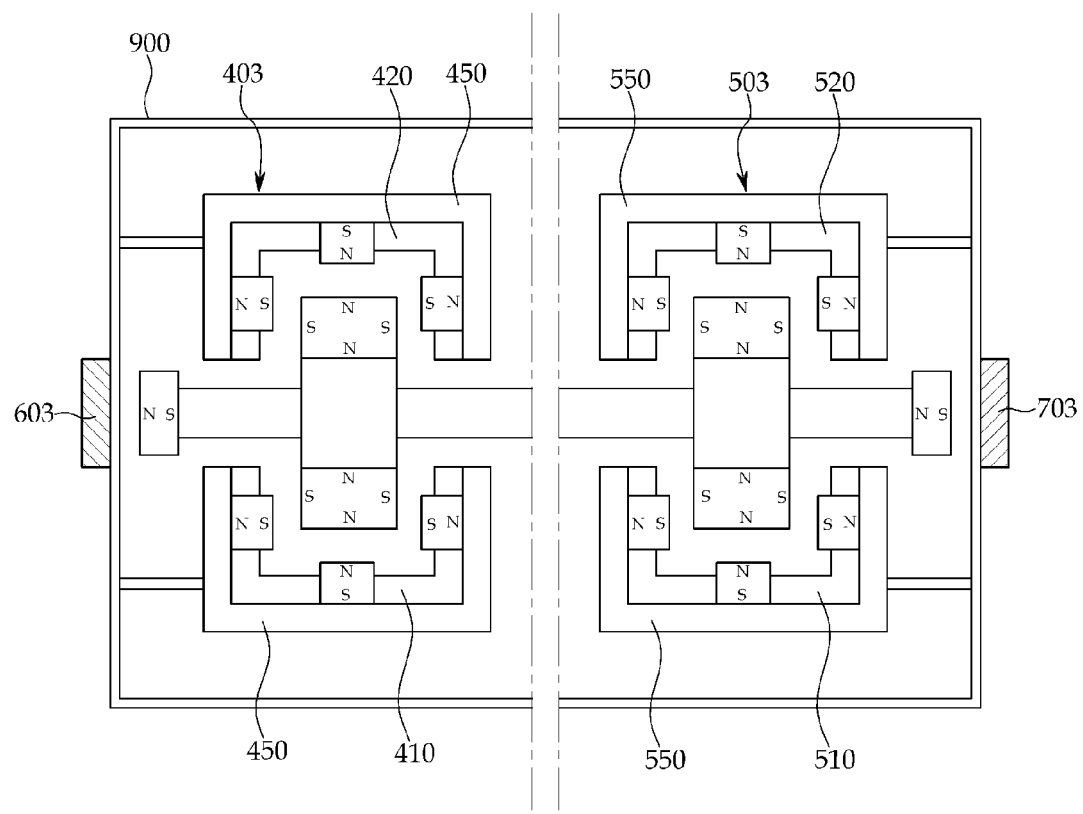
FIG. 11 is a cross-sectional view showing a substrate transfer apparatus, wherein the substrates are transferred horizontally.

A substrate transfer apparatus 30 illustrated in FIG. 11 can transfer a substrate horizontally, not vertically.

In the substrate transfer apparatus 30 of FIG. 11, the first magnet generator and the second magnet generator disposed at each side of the substrate stage 110 are magnetically levitated, accommodated in the accommodation space of a second guide rail 503, such that a horizontally laid carrier can be stably levitated. Therefore, the substrates can be transferred having the substrate stage laid horizontally.

In addition, a first and a second linear motors are horizontally disposed about the carrier, not on the upper or lower portions of the carrier. Accordingly, the first stator 603 and the second stator 703 are also horizontally disposed about the carrier.

Hereinafter, another embodiment of the present invention will be described with reference to FIG. 12.

Figure 12:
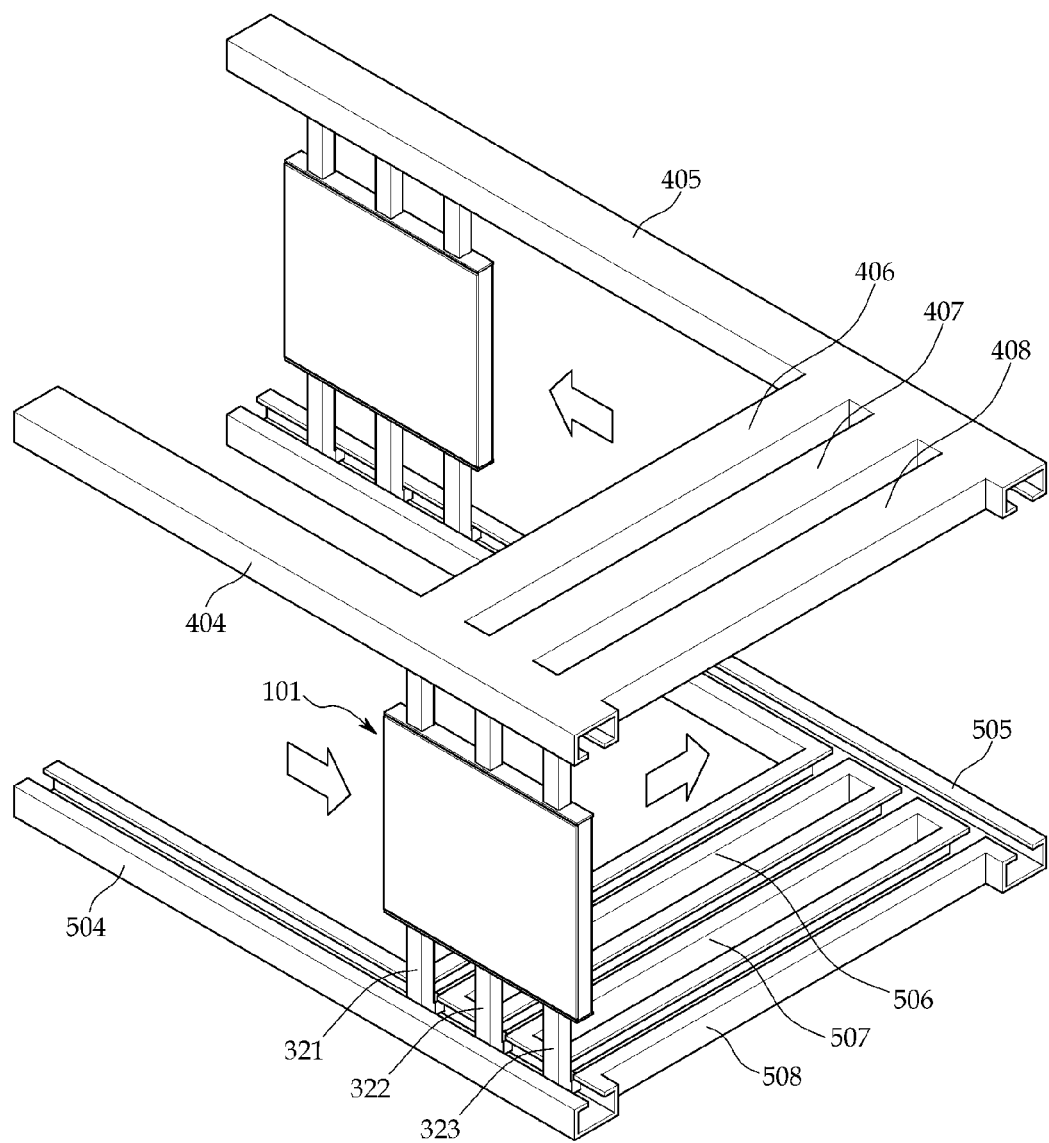
FIG. 12 is an oblique diagram showing a substrate transfer apparatus according to another embodiment of the present invention, including a branch rail for changing direction.

A substrate transfer apparatus 40 illustrated in FIG. 12 includes a branch rail branching off from a first guide rail 404 and a second guide rail 504 to change a substrate transfer direction.

In more detail, the substrate transfer apparatus 40 of FIG. 12 includes three branch rails 406, 407, and 408 branching off from the first guide rail 404 configured to lead the carrier 101 to a first direction. The carrier 101 disclosed in FIG. 3 may be used in the substrate transfer apparatus 40, and the branch rails 406, 407, and 408 lead each of the first magnet generators 211, 212, and 213 of the carrier 101, such that the carrier 101 can be transferred to a direction different from the first direction to which the first guide rail 404 is extended. The branch rails 406, 407, and 408 are connected to a third guide rail 405, such that the carrier 101 may be transferred along the third guide rail 405.

Likewise, the second guide rail 504 includes three branch rails 506, 507, and 508, and the branch rails 506, 507, and 508 lead the second magnet generators 311, 312, and 313 of the carrier 101, such that the carrier 101 may be transferred to a direction different from a direction to which the second guide rail 504 is extended. The branch rails 506, 507, and 508 are connected to a fourth guide rail 505, such that the carrier 101 may be transferred along the fourth guide rail 505.

Although not illustrated in a drawing, the first through the fourth guide rails and each of the branch rail include linear motors. In this case, different linear motors can be properly selected by those skilled in the art where necessary.

In a case where these substrate transfer apparatuses are used, the transfer direction can be easily changed in the substrate transfer process. The branch angle of the branch rails can be adjusted where as necessary.

Hereinafter, another embodiment of the present invention will be described with reference to FIG. 13.

Figure 13:
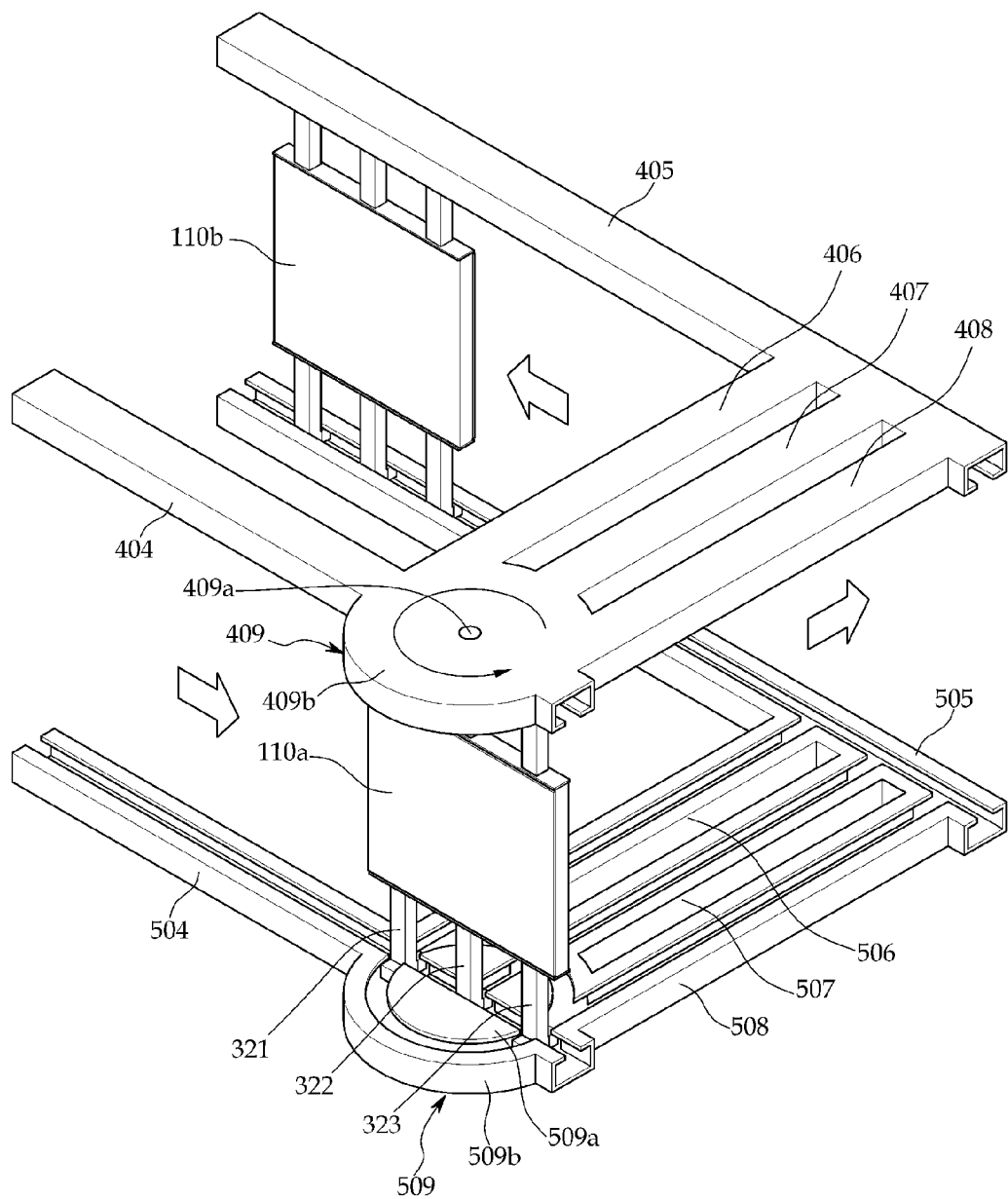
FIG. 13 is an oblique diagram showing a substrate transfer apparatus including a substrate rotating unit.

A substrate transfer apparatus 50 illustrated in FIG. 13 includes a rotating rail 409 in order to rotate the carrier 101. That is, the rotating rail 409 connected to the first guide rail 404 is provided. A rotating rail 509 connected to the second guide rail 504 may be further provided.

The carrier 101 illustrated in FIG. 3, for example, may be applied to the substrate transfer apparatus 50 of FIG. 13. The rotating rail 409 includes a fixed unit 409a configured to fix one of the first magnet generators 212 disposed at the carrier 101 in order to make one of the first support units 222 into a rotation axis, and a rotating unit 409b configured to lead the other two first magnetic generators 211 and 213 to rotate with respect to the fixed unit 409a.

Likewise, the rotating rail 509 of the second guide rail 504 includes a fixed unit 509a configured to fix one of the second magnet generators 312 disposed at the carrier 101 in order to make one of the second support units 322 into a rotation axis, and a rotating unit 509b configured to lead the other two second magnetic generators 311 and 313 to rotate with respect to the fixed unit 509a.

Although not illustrated in a drawing, each of the rotating rails includes a linear motor. In this case, different linear motors can be properly selected by those skilled in the art where necessary.

In a case where these rotating rails are used, the carrier or the substrate can be rotated without any additional chamber or device in the substrate transfer process. Further, if the carriers loaded with substrates are easily rotated, a large range of choices may be available for determining the direction of an opening of a substrate treatment chamber.

For example, in a case where the treatment chamber is located on the front side of the guide rail, a first surface 110a of the substrate stage loaded with a substrate can face the front; whereas in a case where a treatment chamber is located on the back side of the guide rail, the carrier can be rotated, such that a second surface 110b of the substrate stage can face the front and the first surface 110a of the substrate stage loaded with a substrate can face toward the back.

Hereinafter, another embodiment of the present invention will be described with reference to FIG. 14.

Figure 14:
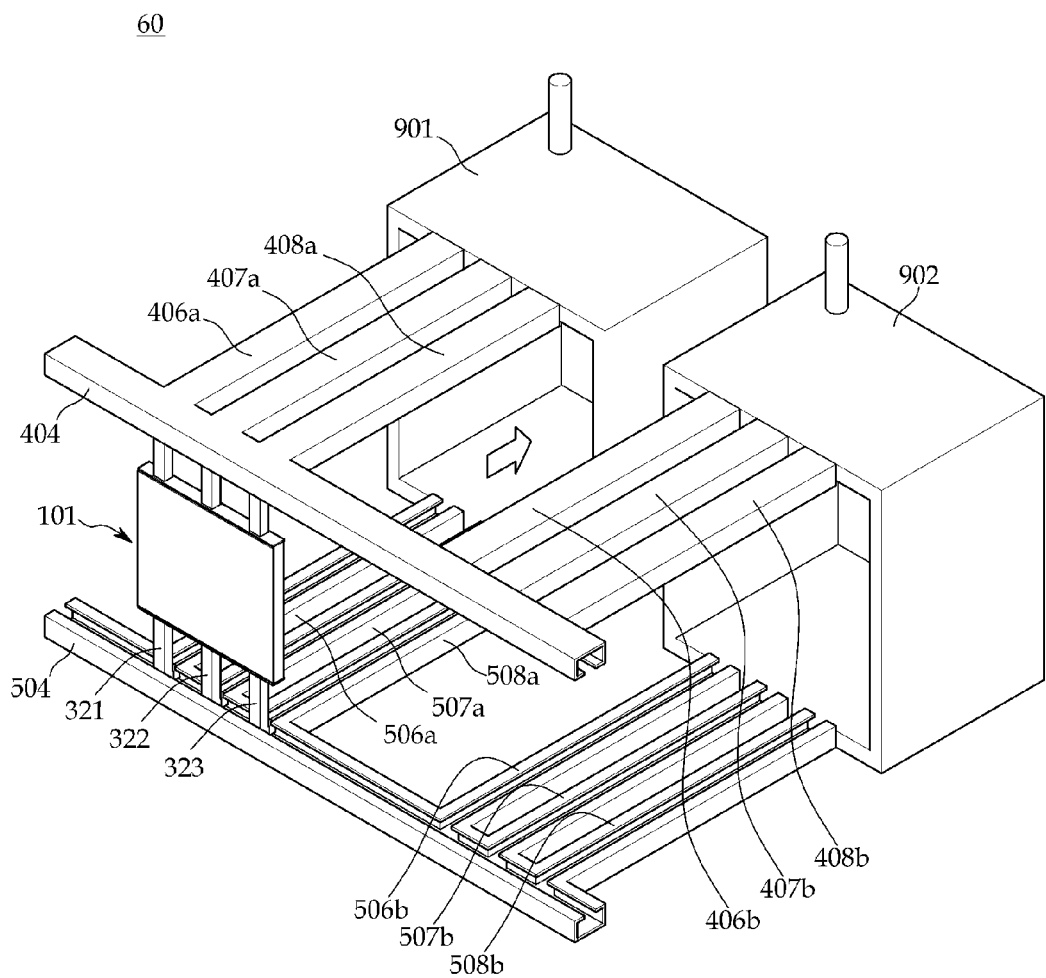
FIG. 14 is an oblique diagram showing a substrate transfer apparatus including a chamber guide rail.

Referring to FIG. 14, a substrate transfer apparatus 60 includes chamber guide rails 406a, 407a, and 408a. The chamber guide rails 406a, 407a, and 408a branch off from the first guide rail 404, and lead the carrier 101 to a chamber. The substrate transfer apparatus 60 may further include chamber guide rails 506a, 507a, and 508a branching off from the second guide rail 504 in order to lead the carrier 101 to the chamber. For example, the carrier 101 disclosed in FIG. 3 can be led to the chamber 901 by using the substrate transfer apparatus 60 illustrated in FIG. 14.

Each of the chamber guide rails 406a, 407a, and 408a branching off from the first guide rail 404 accommodates the first magnet generators 211, 212, and 213, respectively; while each of the chamber guide rails 506a, 507a, and 508a branching off from the second guide rail 504 accommodates the second magnet generators 311, 312, and 313, respectively. Therefore, substrates can be easily transferred to the chamber.

Although not illustrated in a drawing, each of the first and the second guide rails and the chamber guide rails includes a linear motor. In this case, different linear motors can be properly selected by those skilled in the art where necessary.

Meanwhile, the substrate stage 110 of the carrier 101 led to the chamber may block the chamber opening. Thus, additional elements to block the chamber opening with the substrate stage may be further provided, although not illustrated in a drawing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. An apparatus for transferring substrates, comprising:
   a substrate stage including a substrate loading unit;
   a first guide block disposed at a first end of the substrate stage and including a first magnet generator;
   a second guide block disposed at a second end of the substrate stage and including a second magnet generator;
   a first guide rail accommodating the first magnet generator and including a third magnet generator; and
   a second guide rail accommodating the second magnet generator and including a fourth magnet generator,
   the first magnet generator and the third magnet generator exerting repulsive force on each other, and
   the second magnet generator and the fourth magnet generator exerting repulsive force on each other.

2. The apparatus for transferring substrates of claim 1, wherein the first through the fourth magnet generators comprise at least one of a permanent magnet, an electromagnet, and a super conductor.

3. The apparatus for transferring substrates of claim 1,
   wherein the first guide block comprises a first mover,
   wherein the first guide rail comprises a first stator disposed to face the first mover, and
   wherein the first mover and the first stator form a first linear motor.

4. The apparatus for transferring substrates of claim 3, wherein the first stator comprises a plurality of magnets capable of changing polarities depending on the location of the first mover.

5. The apparatus for transferring substrates of claim 3, wherein the first stator comprises a plurality of electromagnets.

6. The apparatus for transferring substrates of claim 3, wherein the first mover is disposed in an accommodation space inside of the first guide rail.

7. The apparatus for transferring substrates of claim 3, wherein the first mover is disposed outside of the accommodation space of the first guide rail.

8. The apparatus for transferring substrates of claim 1, wherein the first guide block comprises:
   a first mover disposed outside of the first guide rail; and
   a first stator spaced apart from the first guide rail and disposed to face the first mover,
   wherein the first mover and the first stator form a first linear motor.

9. The apparatus for transferring substrates of claim 1, further comprising a branch rail branching off from the first guide rail.

10. The apparatus for transferring substrates of claim 1, further comprising a rotating rail connected to the first guide rail.

11. The apparatus for transferring substrates of claim 10, wherein the rotating rail comprises:
    a fixed unit making a rotating axis; and
    a rotating unit leading the first magnet generator accommodated in the first guide rail to rotate with respect to the fixed unit.

12. The apparatus for transferring substrates of claim 1,
    wherein the second guide block comprises a second mover,
    wherein the second guide rail comprises a second stator disposed to face the second mover, and
    wherein the second mover and the second stator form a second linear motor.

13. The apparatus for transferring substrates of claim 12, wherein the second stator comprises a plurality of magnets capable of changing polarities depending on the location of the second mover.

14. The apparatus for transferring substrates of claim 13, wherein the second stator comprises a plurality of electromagnets.

15. The apparatus for transferring substrates of claim 1, wherein the first guide block and the first guide rail do not contact each other, and the second guide block and the second guide rail do not contact each other.

* * * * *